US010099333B2

(12) United States Patent
Belotti

(10) Patent No.: US 10,099,333 B2
(45) Date of Patent: Oct. 16, 2018

(54) WORKING MACHINE WITH CLAMPING DEVICE

(71) Applicant: BELOTTI S.P.A., Suisio (IT)

(72) Inventor: Luciano Belotti, Bergamo (IT)

(73) Assignee: Belotti S.p.A., Susisio (IT)

( * ) Notice: Subject to any disclaimer, the term of this patent is extended or adjusted under 35 U.S.C. 154(b) by 0 days.

(21) Appl. No.: 15/312,351

(22) PCT Filed: May 20, 2014

(86) PCT No.: PCT/EP2014/060369
§ 371 (c)(1),
(2) Date: Nov. 18, 2016

(87) PCT Pub. No.: WO2015/176753
PCT Pub. Date: Nov. 26, 2015

(65) Prior Publication Data
US 2017/0080538 A1    Mar. 23, 2017

(51) Int. Cl.
*B23Q 3/16*    (2006.01)
*B23Q 3/00*    (2006.01)
(Continued)

(52) U.S. Cl.
CPC ............... *B23Q 3/16* (2013.01); *B23C 3/13* (2013.01); *B23Q 3/002* (2013.01); *B23Q 3/069* (2013.01); *H05K 3/0047* (2013.01)

(58) Field of Classification Search
CPC ....... Y10T 408/5623; Y10T 408/56235; Y10T 408/56245; B23Q 3/002; B23Q 3/069; H05K 3/0047
See application file for complete search history.

(56) References Cited

U.S. PATENT DOCUMENTS 4,158,987 A * 6/1979 Smith .................... B26D 7/025
144/135.2
4,515,505 A * 5/1985 Frisbie .................. B23Q 3/002
144/135.2
(Continued)

FOREIGN PATENT DOCUMENTS

DE    2817218 A1 * 10/1979    ............. B23B 49/02
DE    3404555 A1 *  8/1985    ............. B23Q 1/38
(Continued)

OTHER PUBLICATIONS

European Patent Office: International Search Report for International Application No. PCT/EP2014/060369, filed May 20, 2014, Applicant BELOTTI S.P.A., dated Jan. 7, 2015.

*Primary Examiner* — Daniel Howell
*Assistant Examiner* — Yasir Diab
(74) *Attorney, Agent, or Firm* — Patterson Intelletual Property Law, P.C.; Gary L. Montle

(57) ABSTRACT

A working machine comprising a working head (1) having a spindle (10) and which is movable in a xyz working space and further comprising a clamping device (2,3) for clamping pieces (100) to be worked by said machine. The clamping device (2,3) comprises first (21, 31) and second (22,32) clamping means which are movable along a z direction between a first operative position, in which they are in clamping contact with pieces (100) to be worked, and a second non-operative position, in which they are at a distance from said pieces (100), said first (21, 31) and second (22, 32) clamping means being fixed with respect to an xy working plane when in said first operative position and being movable together with said working head (1) in said xy working plane when in said second non-operative position, said first (21, 31) and second (22, 32) clamping means
(Continued)

being alternatively moved between said first and second position during a working cycle of said working machine.

20 Claims, 10 Drawing Sheets

(51) Int. Cl.
*B23Q 3/06* (2006.01)
*B23C 3/13* (2006.01)
*H05K 3/00* (2006.01)

(56) References Cited

U.S. PATENT DOCUMENTS

| | | | |
|---|---|---|---|
| 4,530,627 A * | 7/1985 | Kosmowski | B23Q 3/069 144/135.2 |
| 4,966,508 A | 10/1990 | Otani et al. | |
| 5,199,830 A * | 4/1993 | Otani | B23Q 3/002 408/67 |

FOREIGN PATENT DOCUMENTS

| | | |
|---|---|---|
| DE | 3918120 A1 | 12/1989 |
| JP | H0210 U | 1/1990 |
| JP | H0788710 A | 4/1995 |

* cited by examiner

WORKING MACHINE WITH CLAMPING DEVICE

BACKGROUND

The present invention relates to a working machine comprising a working head and a clamping device. The machine according to the invention is particularly useful for working, e.g. milling, metal stack sheets and in general for working metal pieces when it is necessary to keep clamped the pieces to be worked.

As known, the use of machining centers for milling metal stack sheets, in particular aluminum stack sheets, is becoming more and more popular and is competing with conventional cutting technologies. This is due to the fact that milling technologies allow achievement of an excellent production flexibility combined with a high productivity, thereby guaranteeing reasonably low production costs.

At present, a number of solutions are offered on the market that however, are not completely satisfactory due to a number of reasons.

In particular, one of the problems that may be present in conventional milling machines is the penetration of the coolant among the sheets with the consequent need of further washing of the final piece. Moreover, the inclusion of chips between the sheet components could leave marks on the surface of the sheets, thereby damaging them.

Even more importantly, if the stability of the stack of sheets is not sufficient, it is not possible to guarantee a sufficiently high working precision as well as an operating speed that can be advantageous in terms of productivity.

Based on these remarks, there is clearly the need of providing a working machine, in particular for milling metal stack sheets, which allows the above drawbacks to be eliminated or minimized.

BRIEF SUMMARY

Therefore, the task of the present invention is to provide a working machine, in particular a working machine for milling metal stack sheets, which overcomes or minimizes the drawbacks of known working systems.

In particular, within the scope of this task, an object of the present invention is to provide a working machine, in particular a working machine for milling metal stack sheets, capable of guaranteeing sufficient stability to the pieces, e.g. stack of sheets, to be worked.

Another object of the present invention is to provide a working machine, in particular a working machine for milling metal stack sheets, having an adequate clamping action on the pieces, e.g. stack of sheets, to be worked.

Yet another object of the present invention is to provide a working machine, in particular a working machine for milling metal stack sheets, having relatively high operating speeds.

A further object of the present invention is to provide a working machine, in particular a working machine for milling metal stack sheets, having sufficiently high working precision.

Yet another object of the present invention is to provide a working machine, in particular a working machine for milling metal stack sheets, in which problems of coolant and/or chips penetration among the sheets are avoided or minimized.

A further object of the present invention is to provide a working machine, in particular a working machine for milling metal stack sheets, which is easy to manufacture at competitive costs.

Thus, the present invention, therefore, relates to a working machine comprising a working head having a spindle and being movable in a conventional xyz working space and further comprising a clamping device for clamping pieces to be worked by said machine; the working machine according to the invention is characterized in that said clamping device comprises first and second clamping means which are movable along a z direction between a first operative position, in which they are in clamping contact with pieces to be worked, and a second non-operative position, in which they are at a distance from said pieces, said first and second clamping means being fixed with respect to an xy working plane when in said first operative position and being movable together with said working head in said xy working plane when in said second non-operative position, said first and second clamping means being alternatively moved between said first and second position during a working cycle of said working machine.

In other words, as better described hereinafter, the working machine, e.g. a 3-axis machining center, according to the invention is provided with a clamping device that allows a continuous and effective clamping action be maintained on the pieces to be worked during machining operations.

In practice, the first and the second clamping means are used to keep the stack of sheets in a fixed and stable position during machining operations, with alternating sequences in which: the first clamping means are fixed and exert a clamping action on the pieces while the second clamping means are moved together with the working head, then the second clamping means are fixed and exert a clamping action on the pieces while the first clamping means are moved together with the working head, then again the first clamping means are fixed and exert a clamping action on the pieces while the second clamping means are moved together with the working head, and so on.

As better explained in the following description, the first and second clamping means are therefore able to dynamically follow the movement of the working head and at the same time to guarantee a constant pressure and contact of the clamping device on the pieces to be worked, with a "caterpillar-like" movement. In this way, the stack of sheets [[are]] is always kept under a high pressing action in the tool working area during the entire machining operation.

Advantageously, said clamping device comprises actuating means for alternatively moving said first and second clamping means into said first and second position.

The working machine according to the invention can be a conventional 3-axis machining center having a clamping device mounted thereon, so that said first and second clamping means are mounted on the working head in a movable fashion in the xy plane.

In a preferred embodiment of the working machine according to the present invention, said clamping device comprises centering means that maintain said first and second clamping means in a fixed position in the xy directions with respect to said working head when said first and second clamping means are in said second non-operative position and allow displacement of said first and second clamping means in the xy directions with respect to said working head when said first and second clamping means are in said first operative position. In other words, the centering means keep the first and second clamping means in a fixed relative position with respect to the working head when the first and second clamping means are in the second non-operative position (i.e., the first and second clamping means are moved together with the working head), and allow displacement of said first and second clamping means with respect to the working head when said first and second clamping means are in the first operative position (i.e., they are fixed with respect to the pieces to be worked while the working head is moving with respect to the pieces).

In a largely preferred embodiment of the working machine according to the invention said first and second clamping means respectively comprise a first and a second pressure exerting device. In such a case, preferably said first and second pressure exerting device respectively comprises a first and a second pressure exerting element and a first and a second pressure exerting actuator.

Preferably, said first and second pressure exerting elements are concentrically mounted around said spindle. For the purpose of the present invention, with the term "concentrically mounted around said spindle" it is meant that each of said first and second pressure exerting element is symmetrically positioned with respect to the axis of the spindle and is able to move around a centered position in which their axis in the z direction coincide with the axis of the spindle in the z direction.

According to preferred embodiments, said first and second pressure exerting elements have a substantially cylindrical or frusto-conical geometry.

Advantageously, said first pressure exerting element is concentrically mounted around said spindle at a first distance and said second pressure exerting element is concentrically mounted around said spindle at a second distance greater than said first distance.

Preferably, said centering means comprises one or more springs.

In a possible embodiment of the present invention, said actuating means can comprise a motor-driven shaft comprising a first cam for actuating said first clamping means and a second cam for actuating said second clamping means.

In a further embodiment of the present invention, said actuating means can comprise a first motor-driven shaft comprising a first cam for actuating said first clamping means and a second motor-driven shaft comprising a second cam for actuating said second clamping means.

A further aspect of the present invention relates to a clamping device which is mountable on a working machine comprising a working head having a spindle and being movable in a xyz working space; the clamping device of the invention, which is preferably a pressure exerting device, comprises first and second clamping means which are movable along a z direction between a first operative position, in which they are able to exert a clamping action on pieces to be worked, and a second non-operative position, in which they are at a distance from said pieces, said first and second clamping means being fixed with respect to an xy working plane when in said first operative position and being movable together with said working head in said xy working plane when in said second non-operative position, said first and second clamping means being alternatively moved between said first and second position during a working cycle of said working machine. Further preferred features of the clamping device of the invention are given in the description. The clamping device of the invention can be used with working heads of conventional machining centers, such as a conventional 3-axis machining center.

Moreover, in a still further aspect, the present invention relates also to a machining center comprising a working machine, preferably a milling machine, as described herein and said pieces to be worked preferably comprise stacks of metal sheets.

BRIEF DESCRIPTION OF THE DRAWINGS

Further features and advantages of the present invention will be more clear from the description of preferred but not exclusive embodiments of a working machine according to the invention, shown by way of examples in the accompanying drawings, wherein.

DETAILED DESCRIPTION

Figure 1:
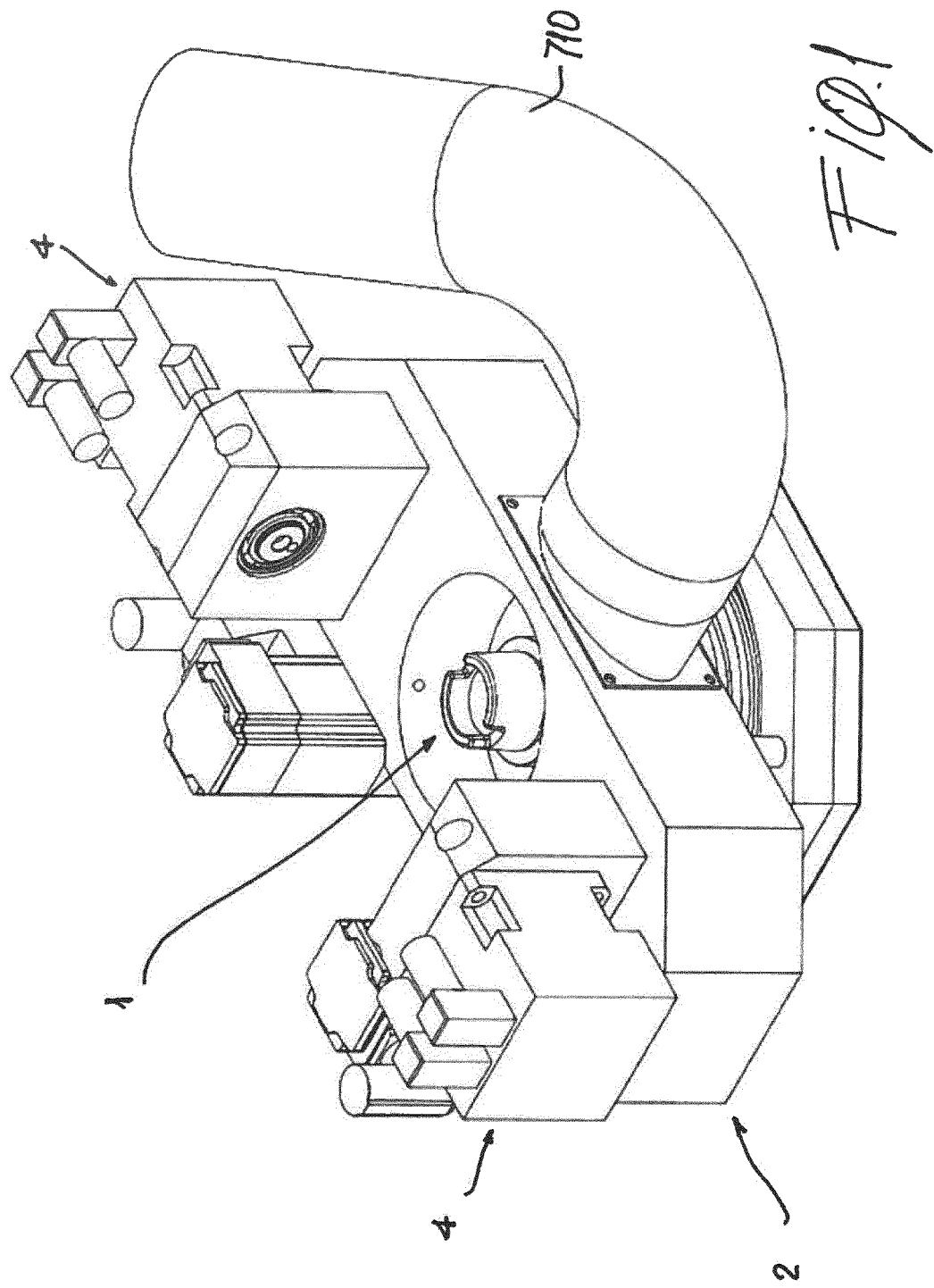
FIG. 1 is a perspective view of a first embodiment of a working machine according to the invention.

With reference to the attached figures, a working machine according to the present invention comprises, in its more general definition, a working head 1 having a spindle 10. The working head can be for instance the working head of a standard 3-axis machining center which is movable in a working space defined by a conventional xyz system of reference axis.

The working machine of the invention further comprises a clamping device 2,3 for clamping pieces 100 to be worked by the machine. The pieces to be worked are generally constituted by a stack of metal sheets 100 superimposed to each other in order to be machined together. Machining of the sheets 100 is advantageously carried out by a milling tool (not shown) mounted on the spindle 10 of the working head 1.

One of the distinguishing features of the working machine of the present invention is given by the clamping device 2,3 which comprises first clamping means 21,31 which are movable along the z direction of the working space between a first operative position, in which they are in clamping contact with the pieces 100 to be worked and a second non-operative position in which they are at a distance from said pieces 100. The clamping device 2,3 further comprises second clamping means 22,32 which are also movable along the z direction of the working space between a first operative position, in which they are in clamping contact with the pieces 100 to be worked and a second non-operative position in which they are at a distance from said pieces 100.

Figure 2:
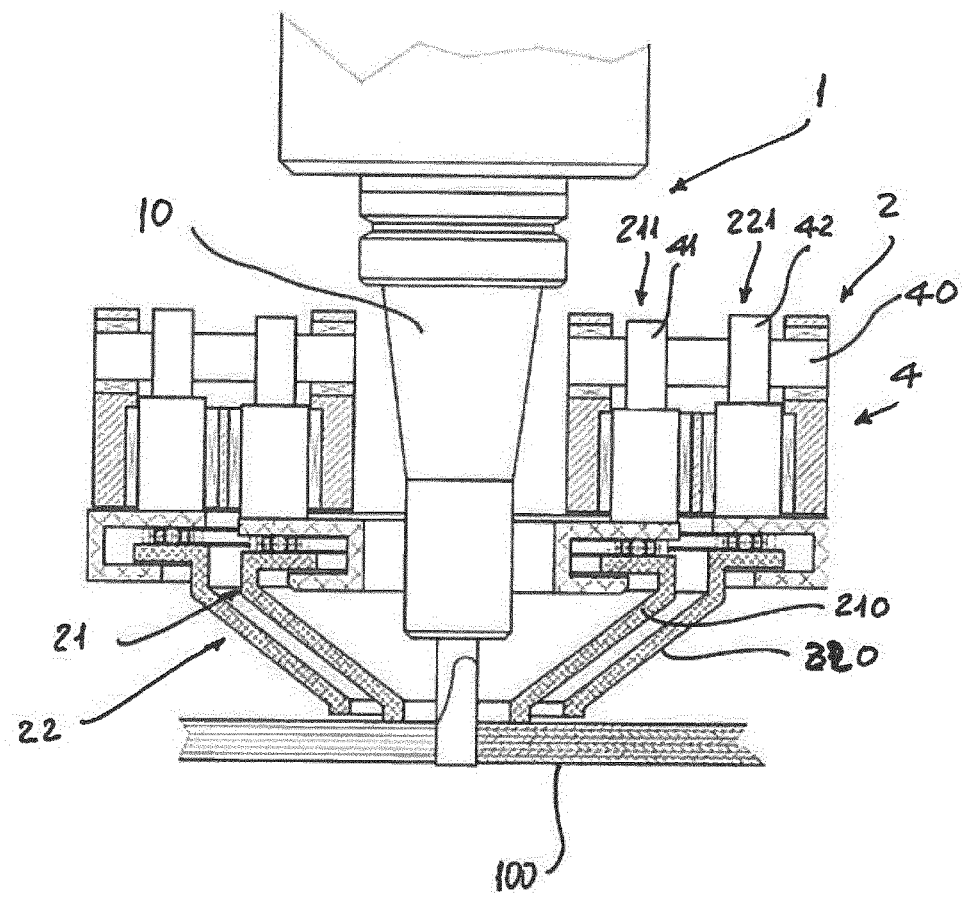
FIG. 2 is a section view of the embodiment of FIG. 1.
Figure 3:
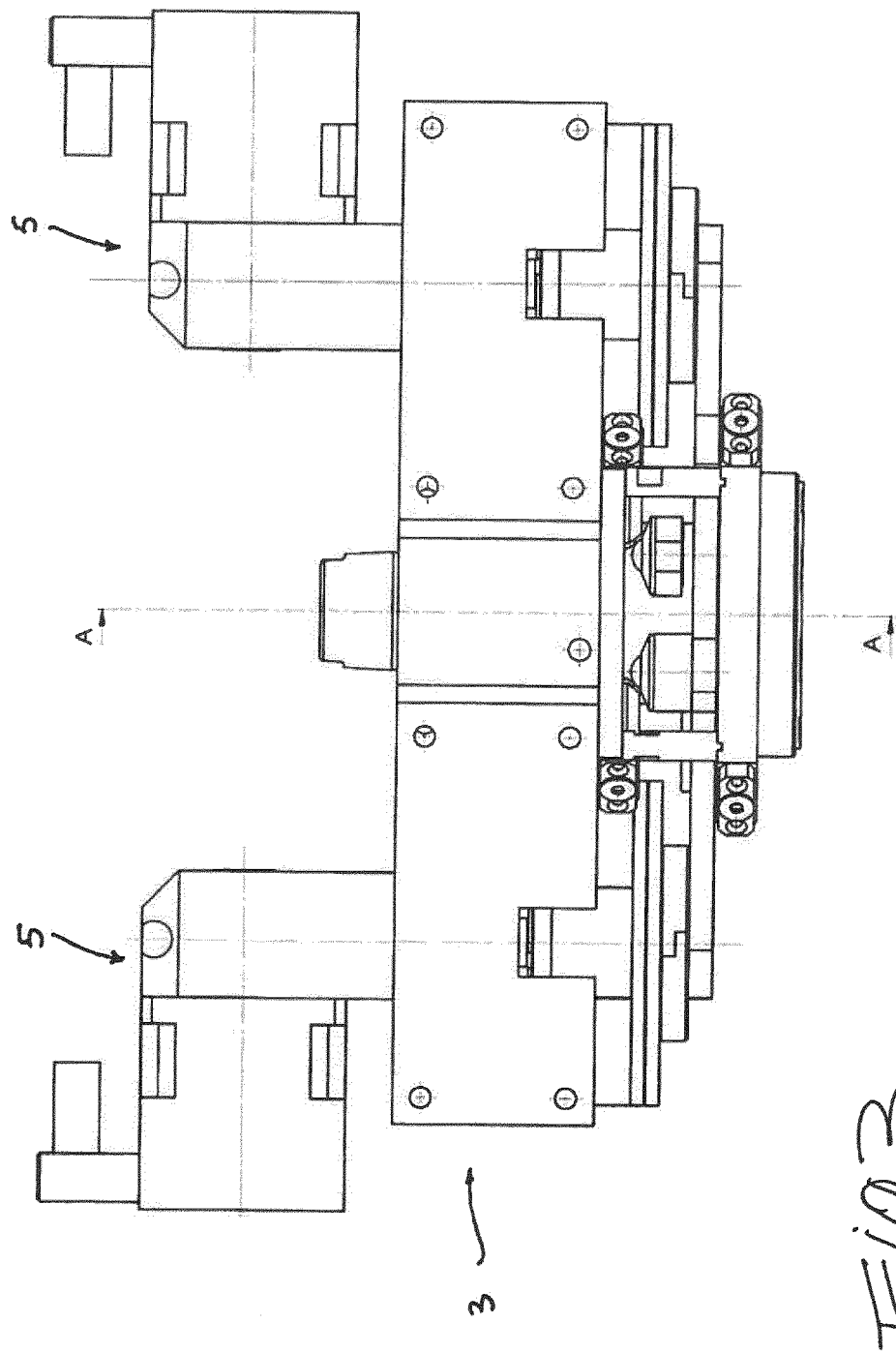
FIG. 3 is a front view of a second embodiment of a working machine according to the invention.
Figure 4:
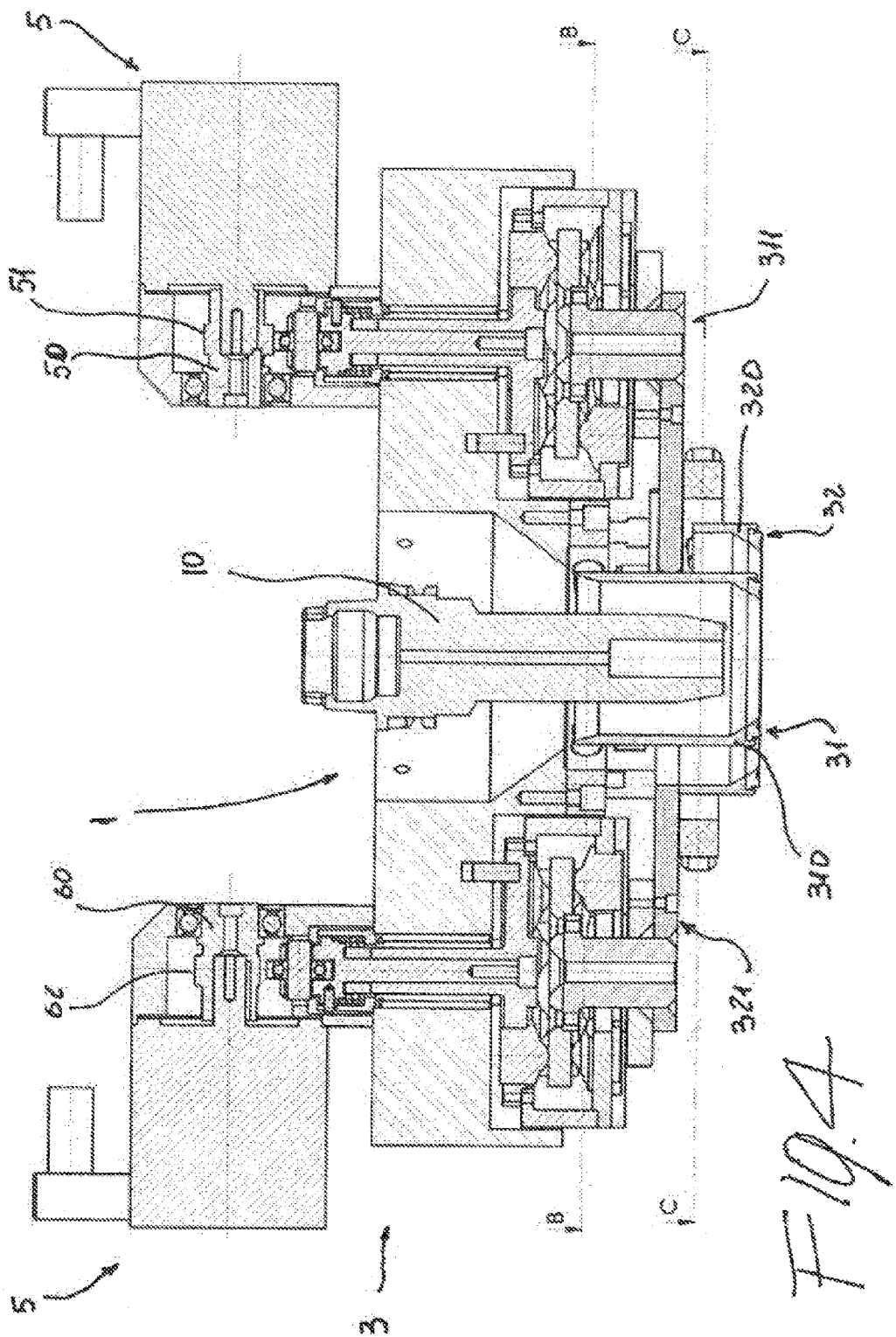
FIG. 4 is a front section view of the embodiment of FIG. 3.
Figure 5:
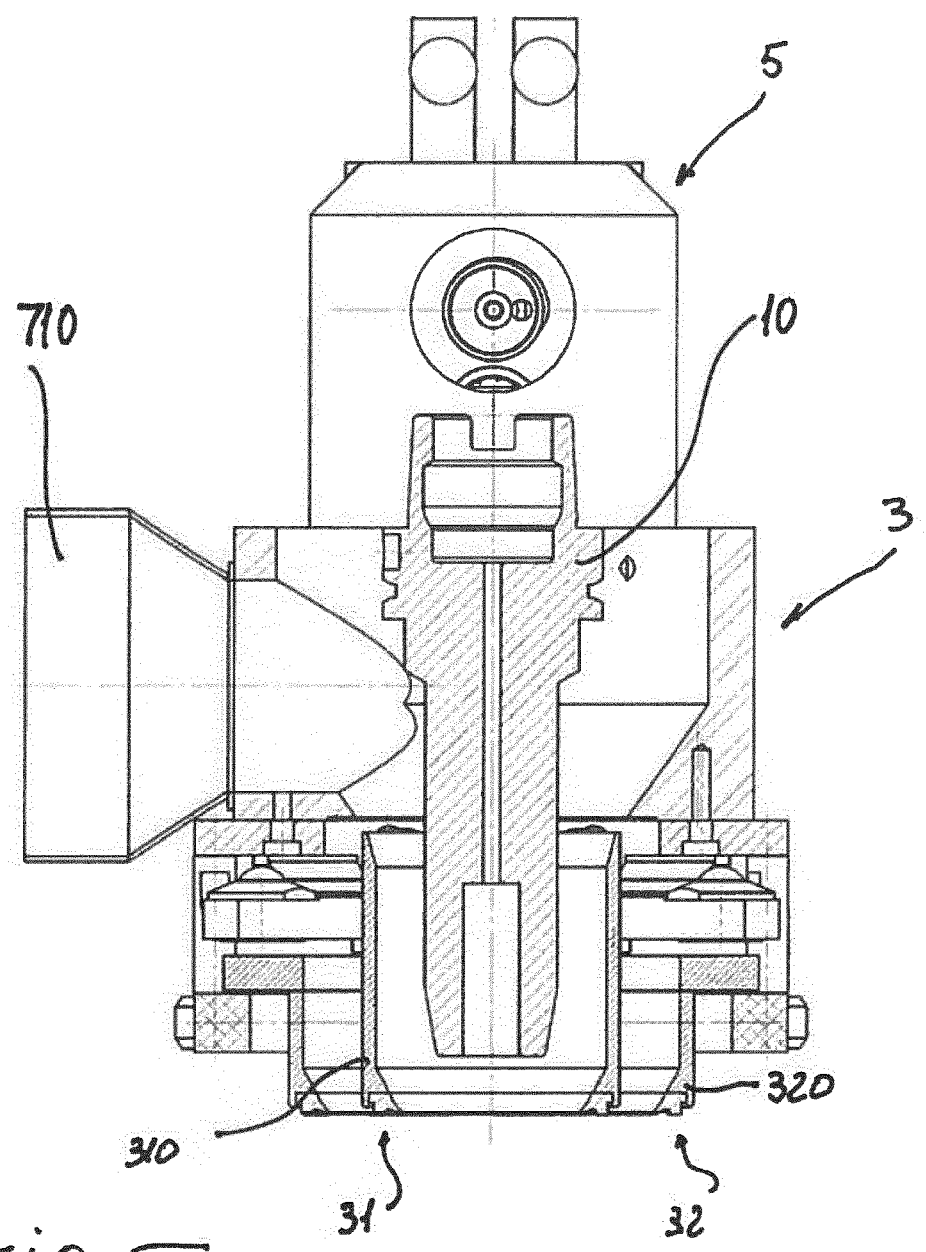
FIG. 5 is a section view of the embodiment of FIG. 3 in the plane A-A.
Figure 8:
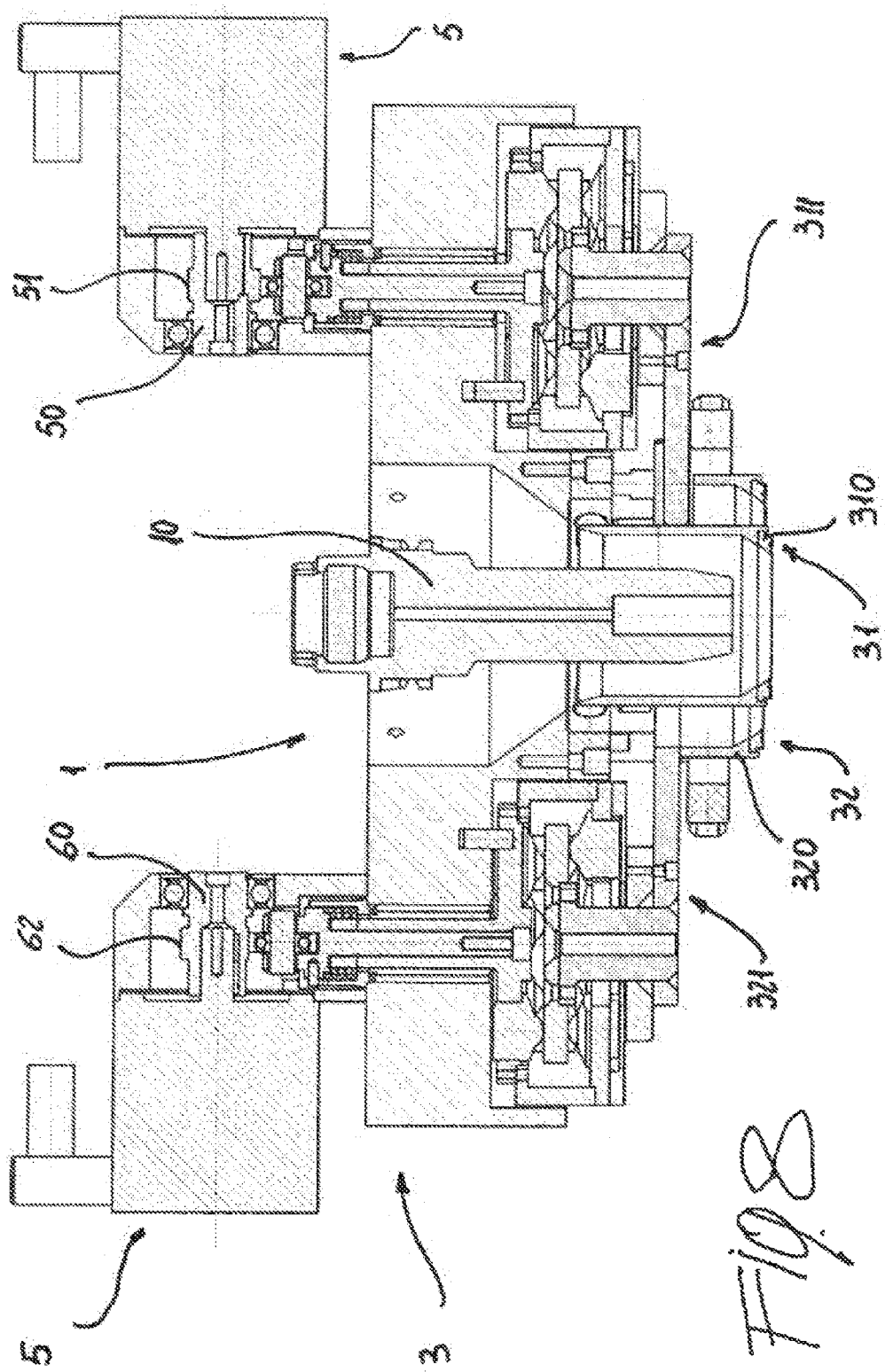
FIG. 8 is a view of the embodiment of FIG. 3 in a first operative position.
Figure 9:
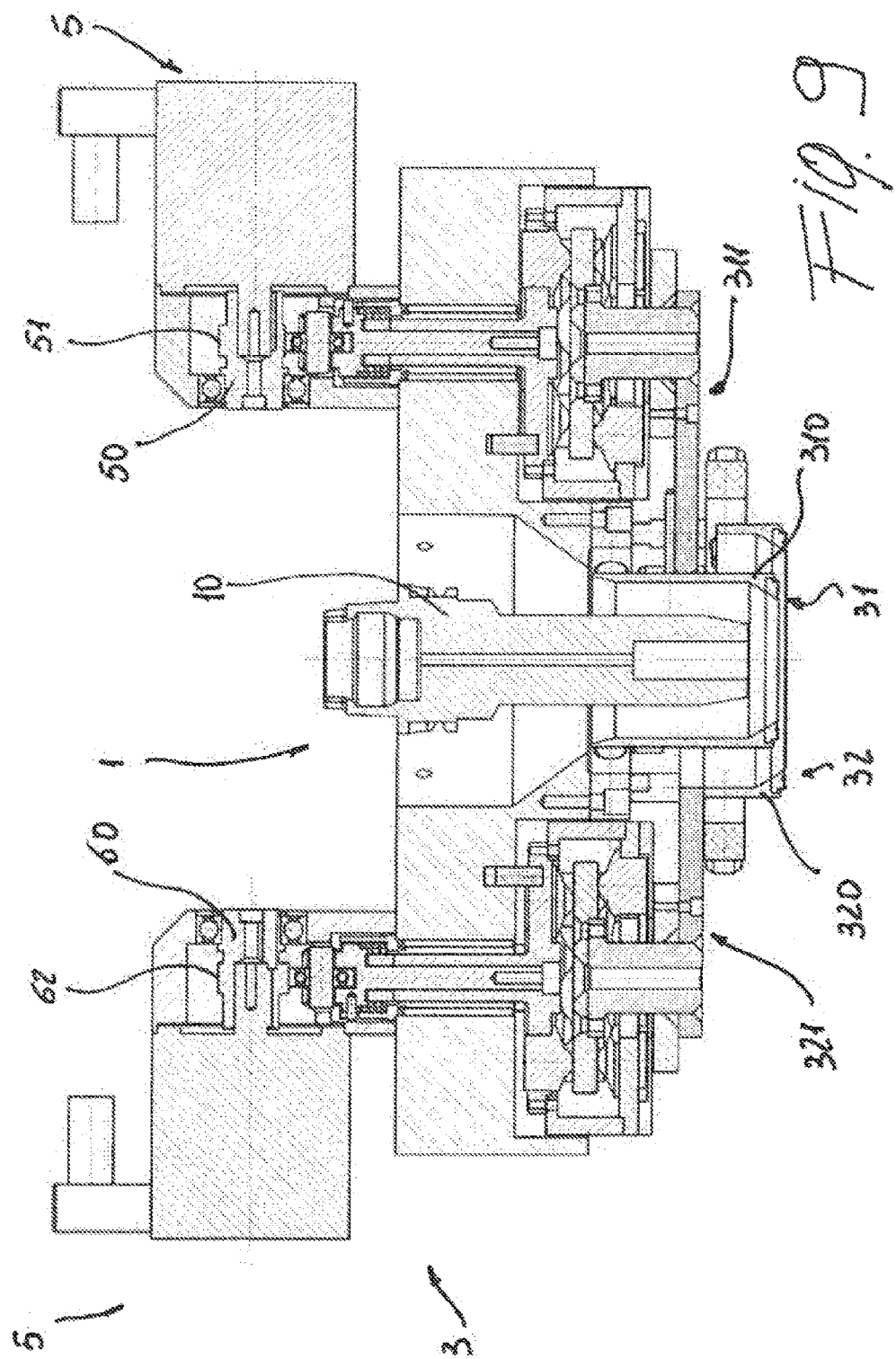
FIG. 9 is a view of the embodiment of FIG. 3 in a second operative position.

For sake of clarity, with reference to FIG. 2, the first clamping means 21 are shown in their first operative position while the second clamping means 22 are shown in their second non-operative position; with reference to FIG. 8, the first clamping means 31 are shown in their first operative position while the second clamping means 32 are shown in their second non-operative position; with reference to FIG. 9, the first clamping means 31 are shown in their second non-operative position while the second clamping means 32 are shown in their first operative position.

A further distinguishing feature of the working machine of the present invention is given by the first clamping means 21,31 which under operation conditions are fixed with respect to the xy directions of the working space when they are in their first operative position, while they are movable together with the working head 1 along the xy directions of the working space when they are in their second non-operative position.

In other terms, when the first clamping means 21,31 are in the first operative position, i.e. when they exert a clamping action on the sheets 100, they are not moved and they do not follow the movement of the working head 1 during the milling action; conversely, when the first clamping means 21,31 are in the non-operative position, i.e. when they are spaced apart from the sheets 100 and do not exert any clamping action, they are moved together with the working head 100 following its movement during the milling action.

Similarly, when the second clamping means 22,32 are in the first operative position, i.e. when they exert a clamping action on the sheets 100, they are not moved and they do not follow the movement of the working head 1 during the milling action, while when they are in the non-operative position, i.e. when they are spaced apart from the sheets 100 and do not exert any clamping action, they are moved together with the working head 100 following its movement during the milling action.

In the working machine according to the present invention a continuous clamping action on the sheets 100 is achieved by alternatively moving the first 21, 31 and second 22,32 clamping means between their first and second position during the working cycle of said working machine. In practice during a working sequence, the first clamping means are maintained in the first operative position and exert a clamping action on the pieces while the second clamping means are moved together with the working head during the milling action; then the second clamping means are moved in their first operative position and exert a clamping action on the pieces while the first clamping means are spaced apart from the pieces and are moved together with the working head during the milling action; then again the first clamping means are brought back in the first operative position and exert a clamping action on the pieces while the second clamping means are spaced apart from the pieces and are moved together with the working head; the sequence is then continued until machining of the pieces is completed. A more detailed sequence of working steps will be given hereinafter with reference to FIG. 10.

In other terms, the first 21,31 and second 22,32 clamping means follow the movement of the working head in the xy directions when they are in their second non-operative position, and they are disengaged from the movement of the working head in the xy directions when they are in their first operative position.

It is clear therefore from the above that in the working machine according to the invention the first 21,31 and second 22,32 clamping means are movable with respect to the working head 1 not only along the z direction, but also along the xy directions, depending on the operating conditions.

In order to actuate the movement of the first 21,31 and second 22,32 clamping means into said first (operative) and second (non-operative) positions, the clamping device 2,3 advantageously comprises actuating means 4,5 which can be of various kinds according to the needs. For instance, mechanical, electromechanical, pneumatic, hydraulic systems or combination thereof as well as of other kinds of actuators can be used. In the attached figures, some examples of electromechanical actuators, which are relatively simple and very effective, are given and will be described in more details hereinafter.

Preferably, the first 21,31 and second 22,32 clamping means respectively comprises a first and a second pressure exerting device.

In particular, with reference with FIGS. 1 and 2 said first and second pressure exerting device respectively comprises a first 210 and a second 220 pressure exerting element and a first 211 and a second 221 pressure exerting actuator.

In the embodiment of FIGS. 1 and 2, the first 210 and a second 220 pressure exerting element have a substantially frusto-conical geometry; other shapes, e.g. a cylindrical or similar shapes are also possible.

As shown in the above mentioned figures, preferably, the first 210 and second 220 pressure exerting elements are concentrically mounted around said spindle 10. As explained hereinabove, the first 210 and second 220 pressure exerting elements have a centered position in which their axis in the z direction substantially coincide with the axis of the spindle in the z direction; the first 210 and second 220 pressure exerting elements are the able to move around said centered position during operation as described further below.

In the embodiment of FIGS. 1 and 2, the actuating means 4 of the first 210 and second 220 pressure exerting elements comprise a motor-driven shaft 40, which in turn comprises at least first cam 41 for actuating said first clamping means 21, in this case the first pressure exerting elements 210, and at least a second cam 42 for actuating said second clamping means 22, in this case the second pressure exerting elements 220. As shown in the above-mentioned figures, the actuating means 4 can advantageously comprise two motor-driven shafts positioned on opposite sides with respect to spindle 10, i.e. in diametrically opposing positions, said shafts being both provided with corresponding first and second cams for actuating the first 21 and second 22 clamping means from opposite sides, thereby guaranteeing a more balanced pressure action. By rotating the shafts 40, the first 210 and second 220 pressure exerting elements are alternatively put their first operating position in clamping contact with the sheets 100. The kinematic chain connecting the first 210 and second 220 pressure exerting elements with the shafts 40 can advantageously comprise actuators, e.g. magnetic or electromagnetic actuators, that helps returning the first 210 and second 220 pressure exerting elements from their first operating position to their second non-operating position.

In the embodiment of FIGS. 3 to 9, the first 310 and a second 320 pressure exerting element have a substantially cylindrical geometry; other similar shapes, e.g. a frusto-conical shape, are also possible.

Also in this case, preferably, the first 310 and second 320 pressure exerting elements are concentrically mounted around the spindle 10. This means that the first 310 and second 320 pressure exerting elements have a centered position in which their axis in the z direction substantially coincide with the axis of the spindle in the z direction; the first 310 and second 320 pressure exerting elements are able to move around said centered position during operation as described further below. Each of said first and second pressure exerting devices respectively comprises a first 310 and second 320 pressure exerting element and a first 311 and a second 321 pressure exerting actuator.

In this respect, according to preferred embodiments of the working machine according to the present invention the clamping device 2,3 can advantageously comprise centering means 6,7 that maintain the first 21,31 and second 22,32 clamping means in a fixed position in the xy plane with respect to said working head when said first 21,31 and second 22,32 clamping means are in the second non-operative position and allow displacement of said first 21,31 and second 22,32 clamping means in the xy plane with respect to said working head 1 when said first 21,31 and second 22,32 clamping means are in said first operative position.

Figure 6:
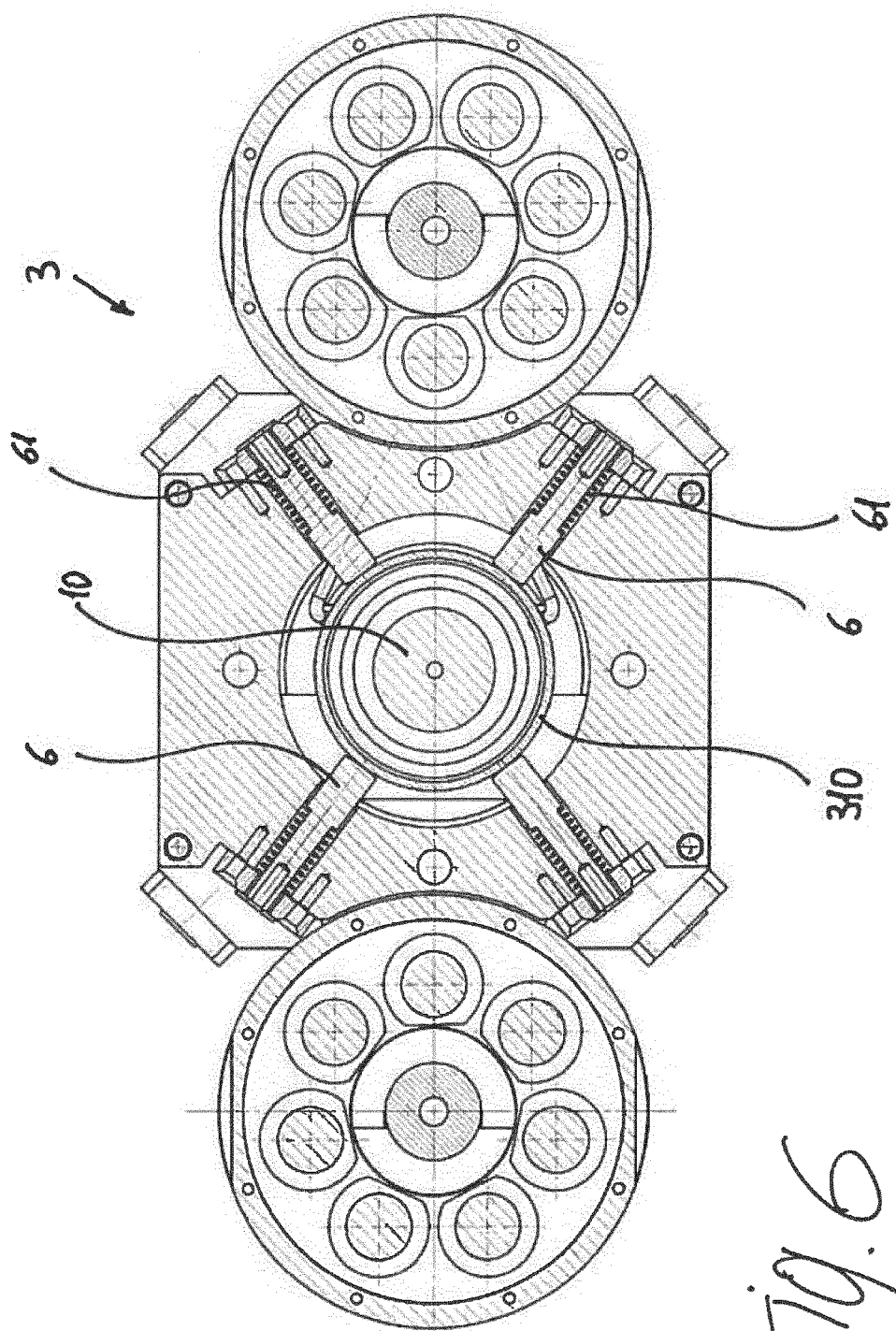
FIG. 6 is a section view of the embodiment of FIG. 4 in the plane B-B.

With reference to FIG. 6, according to such embodiments, the clamping device 3 can advantageously comprise centering means represented by pistons 6 actuated by corresponding spring 61 symmetrically positioned around the first clamping means 31, which in this case comprises a first pressure exerting element 310. When the first pressure exerting element 310 is brought in the first operative position and is pressed against the pieces to be worked, it does not follow the movement of the working head and spindle 10 during the milling operation, i.e. the centering means represented by pistons 6 and corresponding springs 61 allow displacement of said first pressure exerting element 310 in the xy plane with respect to the working head 1. Then, when the first pressure exerting element 310 is brought in the second non-operative position and is spaced apart from the pieces to be worked, thanks to the centering means 6 it is centered with respect to the working head and spindle and follows their movement during the milling operation, i.e. the centering means represented by pistons 6 and corresponding springs 61 bring the first pressure exerting element 310 in a centered and fixed position with respect to the working head.

Figure 7:
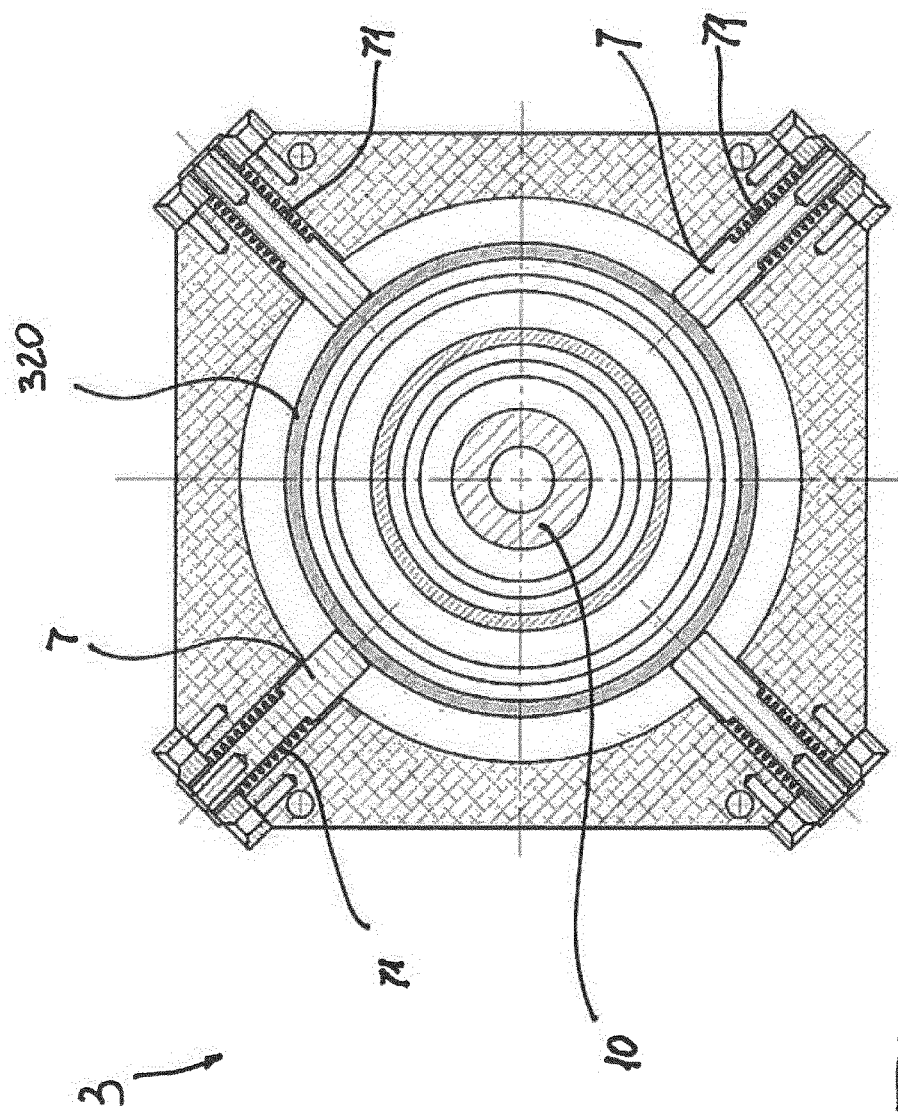
FIG. 7 is a section view of the embodiment of FIG. 4 in the plane C-C.

Similarly, with reference to FIG. 7, according to such embodiments, the clamping device 3 can also advantageously comprise centering means represented by pistons 7 actuated by corresponding spring 71 symmetrically positioned around the second clamping means 32, which in this case comprises a second pressure exerting element 320. When the second pressure exerting element 320 is brought in the first operative position and is pressed against the pieces to be worked, it does not follow the movement of the working head and spindle 10 during the milling operation, i.e. the centering means represented by pistons 7 and corresponding springs 71 allow displacement of said second pressure exerting element 320 in the xy plane with respect to the working head 1. Then, when the second pressure exerting element 320 is brought in the second non-operative position and is spaced apart from the pieces to be worked, thanks to the centering means 7 it is centered with respect to the working head and spindle and follows their movement during the milling operation, i.e. the centering means represented by pistons 7 and corresponding springs 71 bring the second pressure exerting element 320 in a centered and fixed position with respect to the working head.

In the embodiment of FIGS. 3 to 9, the actuating means 5 of the first 310 and second 320 pressure exerting elements 5 comprise a first motor-driven shaft 50 comprising a first cam 51 for actuating the first clamping means 31, in this case the first pressure exerting element 310, and a second motor-driven shaft 60 comprising a second cam 62 for actuating the second clamping means 32, in this case the second pressure exerting element 320.

By rotating the shafts 50 and 60 in a coordinated manner, the first 310 and second 320 pressure exerting elements are alternatively put their first operating position in clamping contact with the pieces to be worked. The kinematic chain connecting the first 310 and second 320 pressure exerting elements with the shafts 50 and 60 can advantageously comprise actuators, e.g. return springs, that helps returning the first 310 and second 320 pressure exerting elements from their first operating position to their second non-operating position.

The working principles can be clearly seen form FIGS. 8 and 9. In FIG. 8, the first pressure exerting element 310 is in its first operative position, while the second pressure exerting element 320 is in its second non-operative position. With a 180° rotation of the shafts 50 and 60 (see FIG. 9), the second pressure exerting element 320 is put in its first operative position thanks to the action of the cam surface 61 of the shaft 60 while the first pressure exerting element 310 is allowed to return in its second non-operative position thanks to the action of springs in the kinematic chain that allows to follow the profile of the cam surface 51 of the shaft 50.

Figure 10:
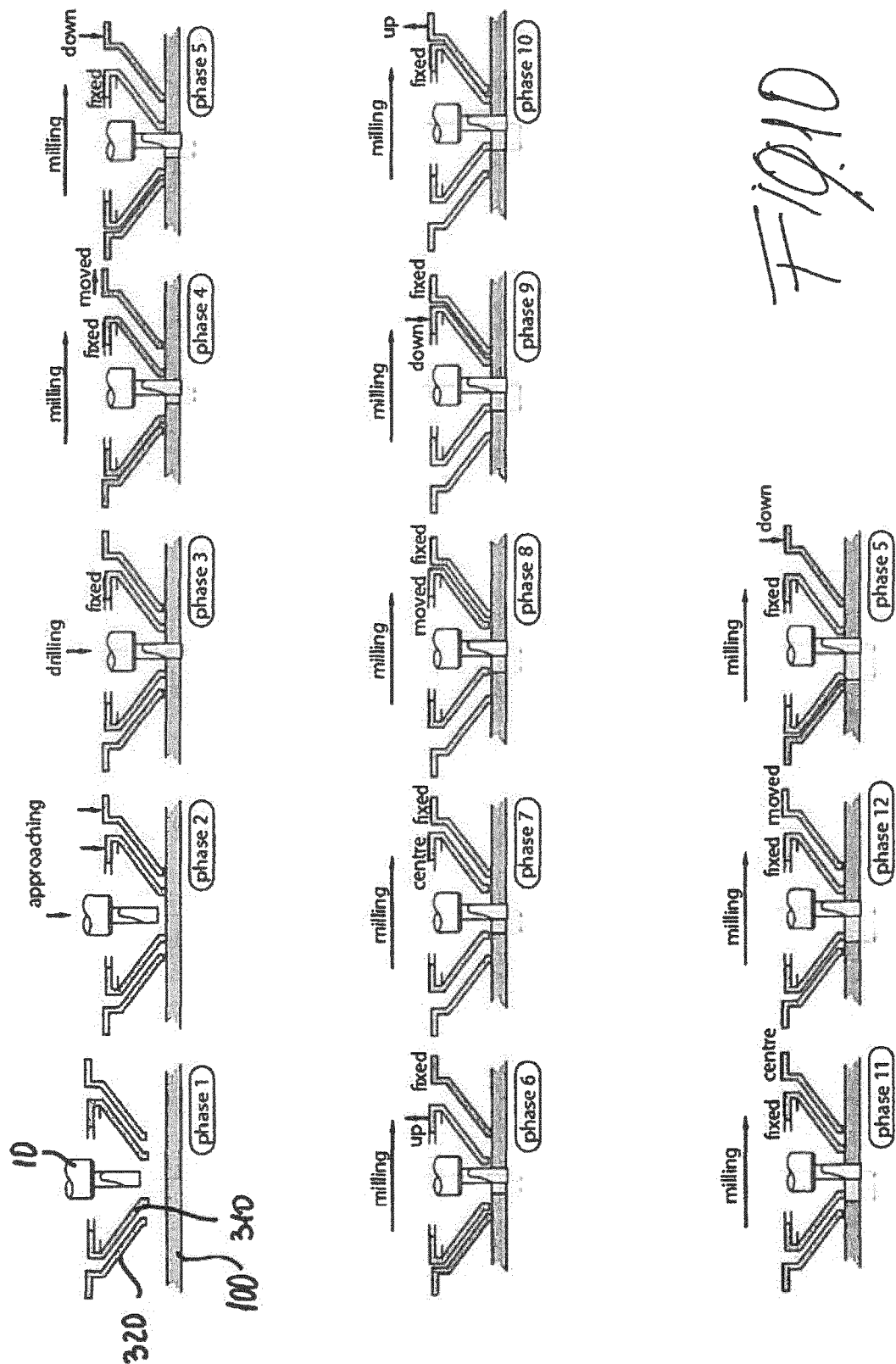
FIG. 10 shows a schematic operating sequence of a working machine according to the invention.

A detailed sequence of the operative steps is hereby given with reference to FIG. 10. For sake of simplicity, in said figure only the spindle 10 with the working tool is represented, while, for what concern the clamping device, only the first 310 and second 320 pressure exerting elements are represented.

In phase 1 the operation is not yet started and the working head with the spindle 10, as well as the first 310 and second 320 pressure exerting elements are spaced apart from the metal stack sheets 100. Also, the first 310 and second 320 pressure exerting elements are centered with respect to the working head (i.e. they are concentrically mounted around the spindle 10).

In phase 2, the working head (i.e spindle 10, first 310 and second 320 pressure exerting elements) approaches the metal stack sheets 100 along the z direction; the first 310 pressure exerting element is put in the first operative position while the second 320 pressure exerting element is kept in the second non-operative position at a distance from the metal stack sheets 100.

In phase 3, the drilling operation is carried out with the first 310 pressure exerting element being in the first operative position (i.e. fixed and in clamping contact with respect to the metal stack sheets 100) while second 320 pressure exerting element is in the second non-operative position.

In phase 4, the milling operation is started and the working head is moved in the xy plane (for simplicity only a straight movement toward the right is shown); the first 310 pressure exerting element is kept in the first operative position while the second 320 pressure exerting element is in the second non-operative position and follows the movement of the working head.

In phase 5, the milling operation is continued; the second 320 pressure exerting element is moved downward along the z direction until it reaches its first operative position (i.e. fixed and in clamping contact with respect to the metal stack sheets 100).

Almost simultaneously, in phase 6, the first 310 pressure exerting element is moved upward along the z direction until it reaches its second non-operative position at a distance from the metal stack sheets 100.

In phase 7, while the milling operation is continued, the centering means (not shown) bring the first 310 pressure exerting element to the central position and maintain it in said position with respect to the working head.

In phase 8, the milling operation is continued and the working head is moved in the xy plane (for simplicity only a straight movement toward the right is shown); the second 320 pressure exerting element is kept in the first operative position while the first 310 pressure exerting element is in the second non-operative position and follows the movement of the working head.

In phase 9, the milling operation is continued; the first 310 pressure exerting element is moved downward along the z direction until it reaches its first operative position (i.e. fixed and in clamping contact with respect to the metal stack sheets 100).

Almost simultaneously, in phase 10, the second 320 pressure exerting element is moved upward along the z direction until it reaches its second non-operative position at a distance from the metal stack sheets 100.

In phase 11, while the milling operation is continued, the centering means (not shown) bring the second 320 pressure exerting element to the central position and maintain it in said position with respect to the working head.

In phase 12, the milling operation is continued and the working head is moved in the xy plane (for simplicity only a straight movement toward the right is shown); the first 310 pressure exerting element is kept in the first operative position while the second 320 pressure exerting element is in the second non-operative position and follows the movement of the working head.

In the subsequent phase, the system is in the situation of phase 5 and the cycle can be repeated until machining of the pieces (e.g. metal sheets) is completed. Thus, the first and second pressure exerting elements are therefore able to dynamically follow the movement of the working head and at the same time to guarantee a constant pressure and contact of the clamping device on the pieces to be worked, with a "caterpillar-like" movement.

As is clear from the above description, the technical solutions adopted for the working machine and working center according to the present invention allow the proposed aims and the objects to be fully achieved.

The working machine according to the invention allows to achieve a constant and high compression action on the tool zone during the entire operation. As a consequence, the stability of the stack of sheets is greatly improved with corresponding improvement of the finishing quality. Moreover, the operating speed can be kept at relatively high values with consequent advantages in terms of productivity. In practice, the working machine according to the invention allows in many cases to fringe completely the pieces, avoiding the usual tags. Normally, it is only necessary to stack precisely the sheets fixing them by a few screws, e.g. four screws, on the extremities on a plywood panel; then the pressure exerted by the clamping device present in the machining center will be sufficient to guarantee stability of the stack around the working area of the milling tool during operation.

Also, the relatively high and constant pressure maintained around the tool working area allows avoidance, or at least minimization, of the problem of the coolant penetration. Such features of the working machine of the invention, together with an efficient suction system 710, helps keeping the working area clean, conveying the chips in a dedicated bin and simplifying the unload of the final pieces.

The working machine of the present invention can be conveniently manufactured by mounting on a conventional working machine, e.g. a standard 3-axis machine equipped with a working head 1 having spindle 10, a clamping device 2,3 that comprises first 21,31 and second 22,32 clamping means which are movable along a z direction between a first operative position, in which they are able to exert a clamping action on pieces 100 to be worked, and a second non-operative position, in which they are at a distance from said pieces 100, said first 21,31 and second 22,32 clamping means being fixed with respect to an xy working plane when in said first operative position and being movable together with said working head 1 in said xy working plane when in said second non-operative position, said first 21,31 and second 22,32 clamping means being alternatively moved between said first and second position during a working cycle of said working machine.

Several variations can be made to the working machine thus conceived, all falling within the scope of the present invention. In practice, the materials used and the contingent dimensions and shapes can be any, according to requirements and to the state of the art.

The invention claimed is:

1. A working machine comprising:
    a work head having a spindle and being movable in an xyz working space;
    a clamp for clamping pieces to be worked by the machine, the clamp comprising
        a first clamp assembly movable along a z-direction between a first operative position configured to place the first clamp assembly in clamping contact with the pieces to be worked, and a second non-operative position configured to place the first clamp assembly at a distance from the pieces, the first clamp assembly configured to be fixed with respect to an xy working plane when in the first operative position and movable together with the work head in the xy working plane when in the second non-operative position;
        a second clamp assembly movable along the z-direction between a first operative position configured to place the second clamp assembly in clamping contact with pieces to be worked, and a second non-operative position configured to place the second clamp assembly at a distance from said pieces, the second clamp assembly configured to be fixed with respect to the xy working plane when in the first operative position and movable together with the work head in the xy working plane when in the second non-operative position; and
        an actuator configured to alternatively move the first clamp assembly and the second clamp assembly into respective first positions and second positions during a working cycle of the working machine,
    wherein the actuator comprises at least one motor-driven shaft including:
        a first cam configured to actuate the first clamp assembly, and
        a second cam configured to actuate the second clamp assembly.

2. The working machine according to claim 1, wherein the first clamp assembly and the second clamp assembly are mounted on the work head such that both the first clamp assembly and the second clamp assembly are movable relative to the work head in the xy plane.

3. The working machine according to claim 2, wherein:
    the first clamp assembly is mounted on the work head such that the first clamp assembly is centered and maintained in a fixed position in the xy plane with respect to the work head when the first clamp assembly is in the second non-operative position, and allowed displacement in the xy plane with respect to the work head when the first clamp assembly is in the first operative position; and
    the second clamp assembly is mounted on the work head such that the second clamp assembly is centered and maintained in a fixed position in the xy plane with respect to the work head when the second clamp assembly is in the second non-operative position, and allowed displacement in the xy plane with respect to the work head when the second clamp assembly is in the first operative position.

4. The working machine according to claim 3, wherein:
at least one spring is configured to center and maintain the first clamp assembly in the fixed position in the xy plane with respect to the work head when the first clamp assembly is in the second non-operative position, and allow the displacement of the first clamp assembly in the xy plane with respect to the work head when the first clamp assembly is in the first operative position; and
at least one spring is configured to center and maintain the second clamp assembly in the fixed position in the xy plane with respect to the work head when the second clamp assembly is in the second non-operative position, and allow the displacement of the second clamp assembly in the xy plane with respect to the work head when the second clamp assembly is in the first operative position.

5. The working machine according to claim 1, wherein:
the first clamp assembly includes a first pressure exertion assembly; and
the second clamp assembly includes a second pressure exertion assembly.

6. The working machine according to claim 5, wherein:
the first pressure exertion assembly includes a first pressure exertion member and a first pressure exertion actuator; and
the second pressure exertion assembly includes a second pressure exertion member and a second pressure exertion actuator.

7. The working machine according to claim 6, wherein the first pressure exertion member and the second pressure exertion member are concentrically mounted around the spindle.

8. The working machine according to claim 7, wherein both the first pressure exertion member and the second pressure exertion member include a substantially cylindrical geometry.

9. The working machine according to claim 7, wherein both the first pressure exertion member and the second pressure exertion member include a substantially frusto-conical geometry.

10. The working machine according to claim 7, wherein:
the first pressure exertion member is concentrically mounted around the spindle at a first distance; and
the second pressure exertion member is concentrically mounted around the spindle at a second distance greater than the first distance.

11. The working machine according to claim 1, further comprising a working center including the working machine.

12. The working machine according to claim 11, wherein the working machine is a milling machine and the pieces to be worked comprise stacks of metal sheets.

13. A clamping device mountable on a working machine, the clamping device comprising:
a work head having a spindle and being movable in a xyz working space;
a first clamp assembly movable along a z-direction between a first clamp assembly first operative position, in which the first clamp assembly is able to exert a clamping action on pieces to be worked, and a first clamp assembly second non-operative position, in which the first clamp assembly is at a distance from the pieces, the first clamp assembly configured to be fixed with respect to an xy working plane when in the first clamp assembly first operative position and movable together with the work head in the xy working plane when in the first clamp assembly second non-operative position;
a second clamp assembly movable along the z-direction between a second clamp assembly first operative position, in which the second clamp assembly is able to exert a clamping action on the pieces, and a second clamp assembly second non-operative position, in which the second clamp assembly is at a distance from the pieces, the second clamp assembly configured to be fixed with respect to the xy working plane when in the second clamp assembly first operative position and movable together with the work head in the xy working plane when in the second clamp assembly second non-operative position; and
an actuator comprising at least one motor-driven shaft including:
a first cam configured to actuate the first clamp assembly to alternatively move between the first clamp assembly first position and the first clamp assembly second position during a working cycle of the working machine, and
a second cam configured to actuate the second clamp assembly to alternatively move between the second clamp assembly first position and the second clamp assembly second position opposite the first clamp assembly during the working cycle of the working machine.

14. The clamping device according to claim 13, wherein the actuator comprises:
a first motor-driven shaft including the first cam configured to actuate the first clamp assembly; and
a second motor-driven shaft including the second cam configured to actuate the second clamp assembly.

15. The clamping device according to claim 13, wherein the first clamp assembly and the second clamp assembly are mounted on the work head such that both the first clamp assembly and the second clamp assembly are movable relative to the work head in the xy plane.

16. The clamping device according to claim 15, wherein:
the first clamp assembly is mounted on the work head such that the first clamp assembly is centered and maintained in a fixed position in the xy plane with respect to the work head when the first clamp assembly is in the first clamp assembly second non-operative position, and allowed displacement in the xy plane with respect to the work head when the first clamp assembly is in the first clamp assembly first operative position; and
the second clamp assembly is mounted on the work head such that the second clamp assembly is centered and maintained in a fixed position in the xy plane with respect to the work head when the second clamp assembly is in the second clamp assembly second non-operative position, and allowed displacement in the xy plane with respect to the work head when the second clamp assembly is in the second clamp assembly first operative position.

17. The clamping device according to claim 16, wherein:
at least one spring is configured to center and maintain the first clamp assembly in the fixed position in the xy plane with respect to the work head when the first clamp assembly is in the first clamp assembly second non-operative position, and allow the displacement of the first clamp assembly in the xy plane with respect to the work head when the first clamp assembly is in the first clamp assembly first operative position; and at least one spring is configured to center and maintain the second clamp assembly in the fixed position in the xy plane with respect to the work head when the second clamp assembly is in the second clamp assembly second non-operative position, and allow the displacement of the second clamp assembly in the xy plane with respect to the work head when the second clamp assembly is in the second clamp assembly first operative position.

18. The clamping device according to claim 13, wherein:
the first clamp assembly includes a first pressure exertion member and a first pressure exertion actuator; and
the second clamp assembly includes a second pressure exertion member and a second pressure exertion actuator.

19. The clamping device according to claim 18, wherein the first pressure exertion member and the second pressure exertion member are concentrically mounted around the spindle.

20. The working machine according to claim 1, wherein the actuator comprises:
a first motor-driven shaft including the first cam configured to actuate the first clamp assembly; and
a second motor-driven shaft including the second cam configured to actuate the second clamp assembly.

* * * * *